(12) United States Patent
Huang

(10) Patent No.: US 6,706,626 B2
(45) Date of Patent: Mar. 16, 2004

(54) METHOD OF FABRICATING CONTACT PLUG

(75) Inventor: Chi-Tung Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 40 days.

(21) Appl. No.: 10/064,525

(22) Filed: Jul. 24, 2002

(65) Prior Publication Data

US 2003/0194859 A1 Oct. 16, 2003

(30) Foreign Application Priority Data

Apr. 16, 2002 (TW) ...................................... 91107694 A

(51) Int. Cl.$^7$ ............................................... H01L 21/44
(52) U.S. Cl. ...................... 438/653; 438/637; 438/672; 438/681; 438/682; 438/683
(58) Field of Search ........................ 438/618, 621–630, 438/637–640, 643–645, 648–649, 652–656, 660, 663–664, 672, 678, 681, 682–683, 685, 687–688

(56) References Cited

U.S. PATENT DOCUMENTS 6,387,799 B1 * 5/2002 Lee .............................. 438/649

6,569,759 B2 * 5/2003 Taguwa ....................... 438/687

* cited by examiner

Primary Examiner—Thanh Nguyen
(74) Attorney, Agent, or Firm—Jiang Chyun IP Office

(57) ABSTRACT

A method for manufacturing contact plug is disclosed. A dielectric layer is formed over a substrate having a conductive region. A contact opening is formed in the dielectric layer and exposing the conductive region within the opening. A first refractory metal layer is formed over the dielectric layer, and the sidewalls and bottom of the contact opening. A first refractory metal nitride layer is formed on the first refractory metal layer. A first plasma treatment step is carried out to transform the first refractory metal nitride layer into a first metal nitrided barrier layer. A thermal-process is carried out to form metal silicide on the conductive region. A second refractory metal nitride layer is formed on the first metal nitride barrier layer. A second plasma treatment step is carried out to transform the second refractory metal nitride layer into a second metal nitrided barrier layer. A conductive metal layer is deposited over the resulting structure and then the top surface is planarized to remove portions of the conductive metal layer, the second metal nitride barrier layer, the first metal nitride barrier layer, and the first refractory metal layer until the dielectric layer is exposed.

18 Claims, 7 Drawing Sheets

METHOD OF FABRICATING CONTACT PLUG

CROSS REFERENCE TO RELATED APPLICATIONS

This application claims the priority benefit of Taiwan application serial no. 91107694, filed on Apr. 16, 2002.

BACKGROUND OF THE INVENTION

1. Field of Invention

The present invention relates generally to semiconductors and more specifically to a method for fabricating contact plug.

2. Description of Related Art

Integrated circuits are manufactured as assemblies of the various devices, such as transistors that make up a chip and many chips are included on a single wafer. In the process of manufacturing integrated circuits, after the individual devices, such as the transistors, have been fabricated in the silicon substrate, they must be connected together to perform the desired circuit functions. This connection process is generally called "metallization", and is performed using a number of different photolithographic and deposition techniques.

The contact plugs are formed to make a solid electrical connection between the underlying device and the overlying interconnection conductive line The fabrication of contact typically involves forming an opening in a dielectric layer and the opening is filled or "plugged" with a metallic layer, such as aluminum or tungsten. However, aluminum or tungsten ions from the contact can migrate into a silicon substrate through a doped region, causing a short to the substrate. To minimize this shorting, some processing techniques deposit a barrier layer before depositing the aluminum or tungsten. One type of barrier material is TiN. While TiN has a good barrier ability, but it needs to be thick enough to effectively function as a barrier layer. Furthermore, as integrated circuit devices are defined more finely, diameter of the contact shrinks and becomes more critical. Thus, thick TiN barrier metal layer is less desirable in high integrated circuits. It has been found that nitride in TiN improves the barrier function, in other words, as the nitride content in TiN increases, the barrier effect also increases. One approach is to implant nitrogen into TiN in order to increase the barrier effect and reduce the thickness of the TiN barrier metal layer in order to meet high integrated structure requirement. One method for implanting the nitrogen into TiN is to perform a nitrogen plasma treatment in an atmosphere of hydrogen gas. Now it is possible to form thinner TiN barrier metal layers meeting the high integrated circuit requirement.

Another commonly used barrier metal layer is formed from metal organic CVD titanium nitride (MOCVD-TiN). Inherently, the MOCVD-TiN material contains impurities such as carbon and oxides, therefore the resistance of MOCVD-TiN material is high. In order to reduce the resistance, one method is to remove these impurities by treating the said barrier layer with a plasma gas containing an atmosphere of nitrogen. However, following the plasma gas treatment, the thickness of the MOCVD-TiN is substantially reduced, consequently, the treated MOCVD-TiN layer so formed has comparatively lower resistance but however the thickness is not adequate to function as a barrier layer effectively.

The effectiveness of the contact is limited by the contact resistance between the barrier metal layer and the doped regions in the substrate. This contact resistance is greater for positively doped regions than for negatively doped regions. Contact resistance is of particular concern in CMOS (complementary metal-oxide-silicon) technology, which includes barrier metal contacts with positively doped regions as well as with negatively doped region. One approach to reduce the contact resistance is to deposit a conformal refractory metal layer into the opening and then annealing the refractory metal layer by performing a thermal process in order to effect a reaction between the metal and the silicon atoms to form metal-silicide. Since metal-silicide has a low resistance, consequently the contact resistance can be reduced. However, one problem with the above conventional contact plug scheme is that the resulting barrier layer following the thermal process offers poor adhesion between the dielectric layer and the tungsten layer.

Applicants have found out that during the thermal process, the oxygen from the ambient reacts with the barrier metal layer to form an oxide film on the surface of the contact barrier metal layer. One problem with the oxide film so formed is, they have a zeta potential value approximately same as the tungsten layer which is commonly used for filling into the contact opening. Because of the similar zeta potential value of the barrier metal layer and the tungsten layer, they tend to repel from each other.

Therefore, the oxide film formed on the barrier metal layer prevents the tungsten layer from adhering onto the surface of the barrier metal layer. Consequently voids are formed within the tungsten layer leading to electromigration failure. Because the oxide film has a poor adhesion property due to zeta potential, adhesion between the dielectric layer and the tungsten layer in the contact is poor. As difference in thermal coefficient of expansion between conductive layer such as tungsten and the dielectric layer is large, therefore during the subsequent thermal process, the thermal stress due to thermal expansion is large. Consequently, the conventional barrier metal layer is not strong enough to resist the thermal expansion and are fractured. Consequently, because the barrier metal layer structure is damaged, it promotes the diffusion of ions or atoms from the conductive layer such as aluminum or tungsten atoms into the substrate, causing shorting of device. Because the lattice structure of the conductive layer has been damaged, it promotes voids formation due to electromigration causing total failure of device.

Therefore in the foregoing problems as described above, the present invention provides a solution to solve the above problems.

SUMMARY OF INVENTION

The present invention provides a method for fabricating contact plug so as to eliminate the electro-migration of conductive material in the contact.

The present invention provides an improved method for forming contact plug to reduce the contact resistance. Therefore the RC delay time can be reduced, thus the operating speed of the device can be substantially increased.

The present invention provides a method of contact barrier metal layer to improve the adhesion ability between the dielectric layer and the conductive layer so that cracking or fracturing of barrier metal layer can be prevented. Thus increasing the reliability of the semiconductor device.

The present invention provides a method of contact barrier metal layer to improve the gap-fill ability of the conductive material and to increase adhesion ability between the dielectric layer and the conductive layer so that generation of voids can be prevented. Thus device failure due to electromigration can be effectively prevented thereby increasing the reliability of the semiconductor device.

The present invention provides a method for forming a contact metal barrier layer so that the adhesion ability between the dielectric layer and the conductive layer in a contact can be increased. Thus eliminating the defects due to electromigration, thereby increasing the reliability of the semiconductor device.

According to one of the preferred embodiment, the present invention provides an improved method for fabricating contact plug. A semiconductor substrate having a conductive region is provided, a dielectric layer is formed over the entire substrate, the dielectric layer is etched to form a contact opening, wherein the conductive region is exposed within the contact opening. A pre-clean process is carried out to remove the residues which would otherwise increase the contact resistance. The contact opening is coated with a first refractory metal layer. Next, a second refractory metal nitride layer is deposited over the first refractory metal layer, then a first plasma treatment is carried out to transform the second refractory barrier metal layer into a nitrided barrier layer. The first plasma treatment preferably comprises a plasma gas including nitrogen and hydrogen gas. A thermal-process is carried out in order to effect a reaction between the silicon atoms of the conductive region and the first refractory metal layer to form a metal-silicide in order to reduce the contact resistance. Then a third refractory metal nitride layer is deposited on the first metal nitride barrier layer and similarly treated with a plasma gas including nitrogen and hydrogen gas to remove the impurities from the third refractory metal nitride layer and to transform the third refractory metal nitride layer into a second nitrided barrier layer and then a conductive layer is deposited filling the contact opening.

It is to be understood with the approach of the present invention that by performing a thermal process is to effect a reaction between the silicon in the conductive region and the first refractory metal layer is to form a metal-silicide layer. Because the metal-silicide has a low resistance, therefore the contact resistance can be substantially reduced. Thus the operating speed of the device can be substantially increased.

Further, it is to be understood with the approach of the present invention that by performing a thermal process and then forming a second metal nitride barrier layer is to eliminate the formation of oxide film on the surface of the second metal nitride barrier layer so that the repulsion between the second metal nitride barrier layer and the conductive layer can be effectively eliminated in order to facilitate good gap fill of the conductive layer and to promote adhesion between the dielectric layer and the conductive layer. Because the zeta potential values of the second metal nitride barrier layer and the conductive layer are largely different, there will be no repulsion between them, consequently no voids are generated, thus the electromigration failure can be effectively prevented. Because the adhesion between the dielectric layer and the conductive layer is increased, cracking of the first refractory metal layer, the first and second metal nitride barrier layers can also be effectively prevented. Because the first refractory metal layer, the first and the second metal nitride barrier layers are not cracked or fractured, therefore the first and second metal nitride barrier layers can effectively prevent the diffusion of metal ions or atoms into the dielectric layer, thus shorting of devices can be prevented. Since the lattice structure of the conductive layer in the contact is not damaged and the adjacent first refractory metal layer, the first and the second metal nitride barrier layers are undamaged, generation of voids due to electromigration can be prevented, thus defects due to electromigration can be eliminated. Therefore the reliability of the device can be substantially increased.

The above and additional advantages of the present invention will become apparent to those skilled in the art from the following detailed description when taken in conjunction with the accompanying drawings.

DETAILED DESCRIPTION

Figure 1:
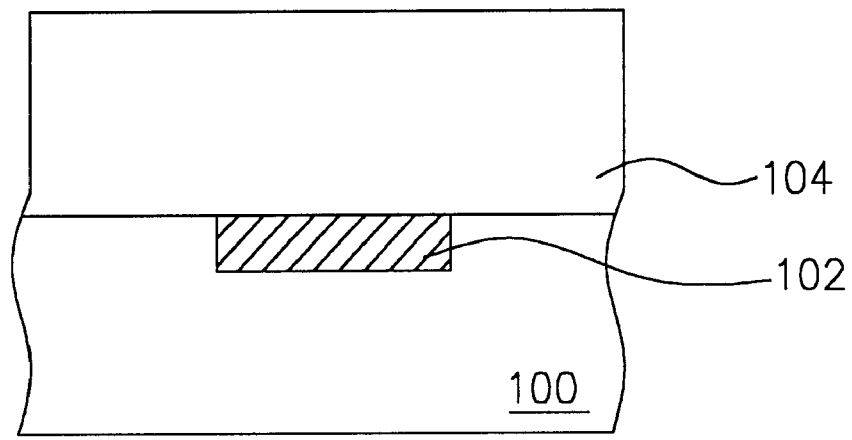
FIGS. 1 through 9 are schematic, cross sectional views showing the progression of manufacturing steps in the present invention provides an improved method for forming contact plug to reduce the contact resistance. Therefore the RC delay time can be reduced, thus the operating speed of the device can be substantially increased. fabricating contact plug in accordance to the first preferred embodiment of the present invention.

Reference will be made in detail to the present preferred embodiments of the invention, examples of which are illustrated in the accompanying drawings. Wherever possible, the same reference numbers are used in the drawings and the description to refer to the same or like parts. FIGS. 1 through 9 are schematic, cross sectional views showing the progression of manufacturing steps in fabricating contact plug in accordance to the first preferred embodiment of the present invention.

FIGS. 1 through 9 are schematic, cross sectional views showing the progression of manufacturing steps in fabricating contact plug in accordance to the first preferred embodiment of the present invention.

Referring to FIG. 1, a substrate 100 having a conductive region 102 formed thereon, is provided. The conductive region 102 is comprised of, for example, a doped region in a silicon substrate, a silicon-based conductive line, a silicon-based gate structure, and the like. A dielectric layer 104 composed of low dielectric constant material, for example spin-on-polymers (SOP) materials, is formed over the substrate 100. A CMP process is performed to remove excess dielectric layer 104 to planarize the dielectric layer 104 to obtain a planar topography top surface as shown in FIG. 1.

Figure 2:
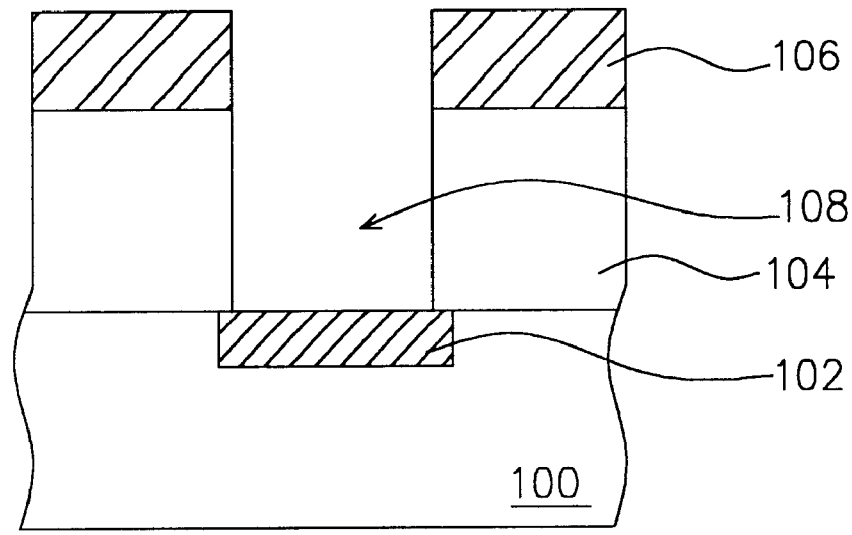

Referring to FIG. 2, a photoresist layer is deposited over the dielectric layer 104. A photoresist layer is shaped or patterned to form a contact opening etch mask 106 as shown in FIG. 2. Next, a contact opening 108 is formed by etching the dielectric layer 104 where exposed by the mask 106 until the conductive region 102 is exposed within the opening 108. The etch process used is preferably highly anisotropic and may, for example be performed by reactive ion etching (RIE) by using a suitable plasma gas.

Figure 3:
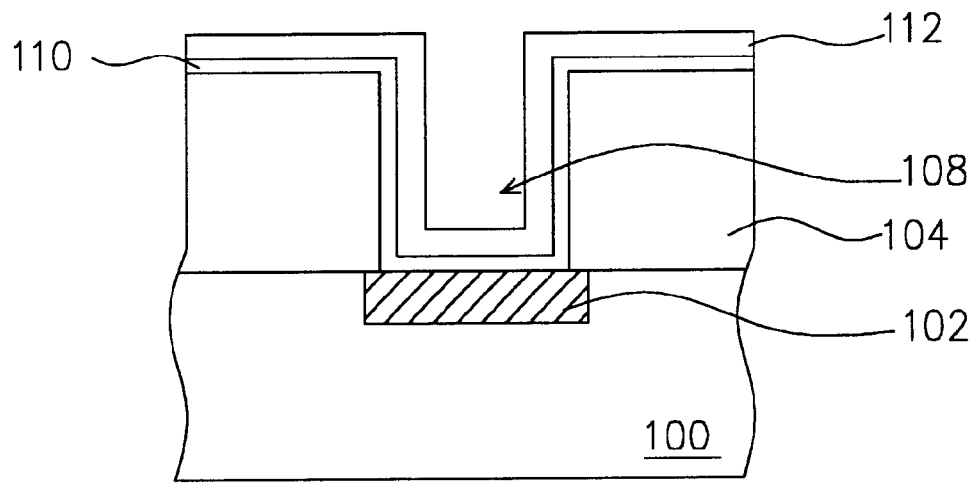

Referring to FIG. 3, the mask 106 is then removed, or stripped, the removal process is preferably a dry etch process using an oxygen plasma or a wet etching process using a suitable solvent. A pre-clean step is carried out to clean the resides from the surface of the dielectric layer 104, and more importantly, to clean the residues from the surface of the sidewall and the bottom of the contact opening which would otherwise increase the contact resistance. The pre-clean step comprises a wet etch or a dry etch process, wherein the pre-clean step use buffer oxidant agents. In the dry etch process, preferably a plasma gas formed from argon gas is used. A thin conformal layer of a first refractory metal layer 110 is formed over the dielectric layer 104 and the contact opening 108. The first refractory metal layer 110, for example, is made of titanium (Ti), or tantalum (Ta). Next, a first refractory metal nitride layer 112 is formed over the first refractory metal layer 110. The first refractory metal nitride layer 112 is deposited preferably by performing a MOCVD method, using a precursor such as tetrakis-dimethylamido-titanium (TDMAT) or tetrakis-diethylamido-titanium (TDEAT), at a process temperature of about 400–450° C. and a preferable thickness of about 120–160 angstroms. The material of the first refractory metal nitride layer is preferably made of titanium nitride (TiN) or tantalum nitride (TaN).

Figure 4:
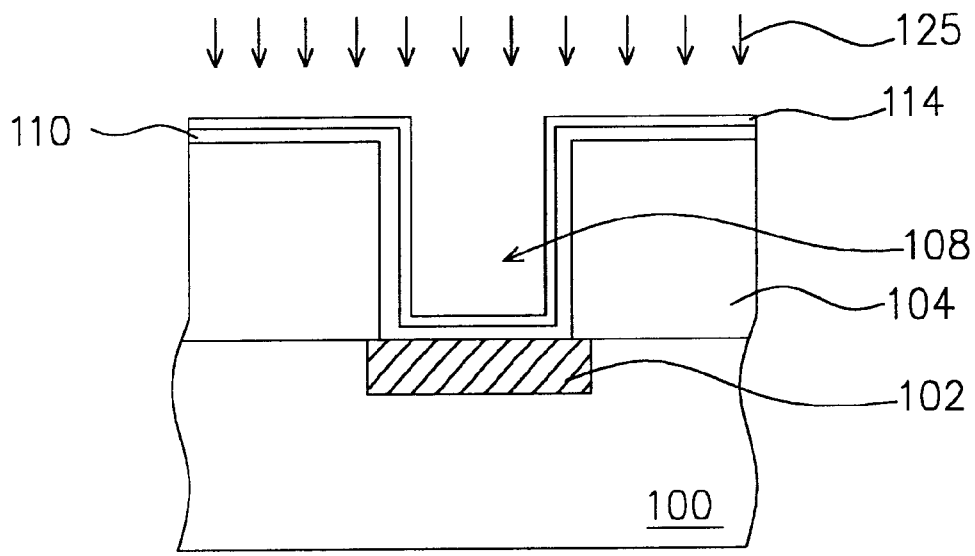

Referring to FIG. 4, a first plasma treatment 125 is carried out in order to remove impurities such as carbon, oxides which are inherently present in the first refractory metal nitride layer 112, consequently the first refractory metal nitride layer 112 is transformed into a thinner first metal nitride barrier layer 114, reduced to a thickness of about 40–60 angstroms. The first plasma treatment 125 comprises preferably a plasma gas containing nitrogen and hydrogen. The first metal nitride barrier layer 114 has comparatively lower resistance.

Figure 5:
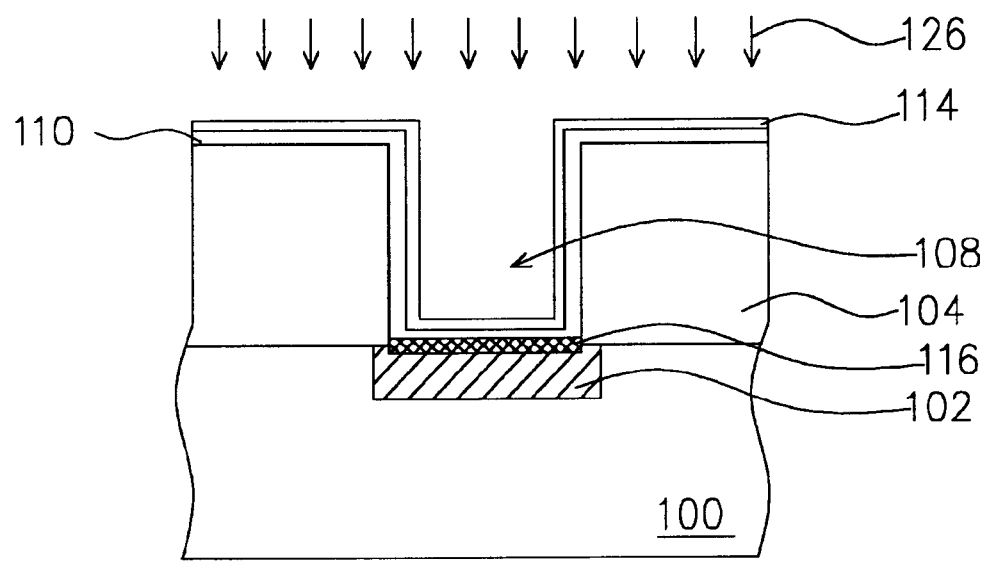

Referring to FIG. 5, a thermal-process 126 is carried out to trigger a reaction between the portion of the first refractory metal layer 110 on the conductive region 102 and the silicon atoms of the conductive region 102 to form a metal silicide film 116. Preferably, the thermal process comprises a rapid-thermal-process (RTP). The RTP is carried out preferably in an atmosphere of nitrogen, at a temperature of about 550–700° C., for a duration of 3–180 seconds. Since the metal silicide film 116 is refractory metal having low resistivity, the contact resistance is decreased.

Figure 6:
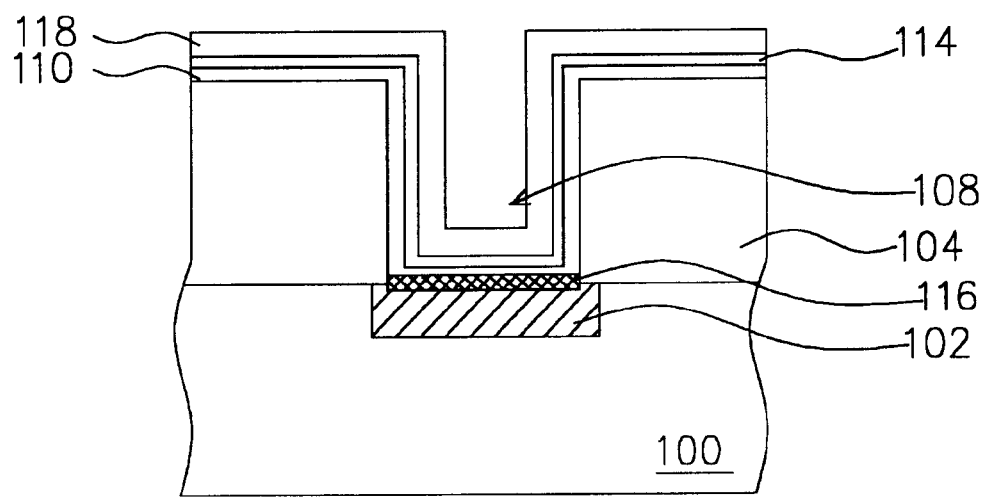

Referring to FIG. 6, a second refractory metal nitride layer 118, is formed on the first metal nitride barrier layer 114. The material of the second refractory metal nitride layer 118 is substantially made of same material as the first refractory metal nitride layer 112. The second refractory metal nitride layer 118 is preferably deposited by using a conventional deposition technique such as MOCVD, and a preferable thickness of about 120–160 angstroms.

Figure 7:
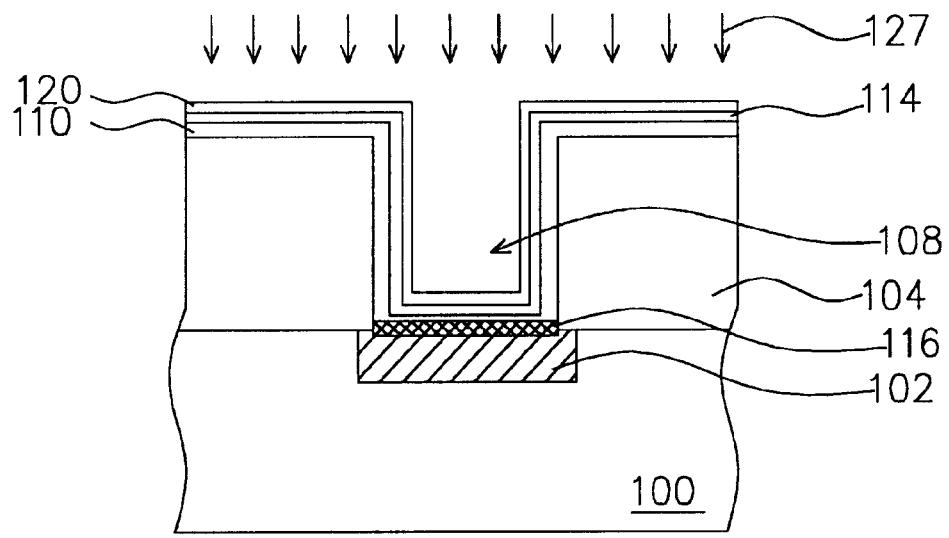

Referring to FIG. 7, similarly a second plasma treatment 127 is carried out to remove impurities and to transform the second refractory metal nitride layer 118 into a thinner second metal nitride barrier layer 120, reduced to a thickness of about 40–60 angstroms. The second plasma treatment 127 reaction conditions comprises preferably a plasma gas containing nitrogen and hydrogen. The second metal nitride barrier layer 120 has a comparatively lower resistance.

Figure 8:
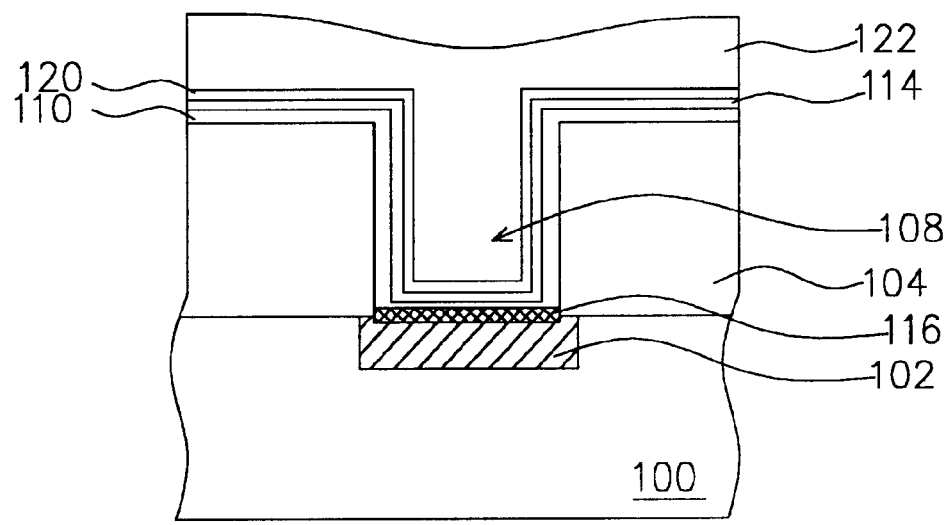

Referring to FIG. 8, a conductive metal layer 122, for example tungsten is deposited over the dielectric layer 104 filling the contact opening 108 by performing a conventional metal deposition technique, such as CVD, or electrochemical deposition (ECD) method. As the zeta potential values of the second metal nitride barrier layer 120 and the conductive layer 122 are largely different, so they do not repel from each other resulting in a good gap-fill. Therefore adhesion between the dielectric layer 104 and the conductive layer 122 is increased, consequently cracking of the barrier layer can be effectively prevented.

Figure 9:
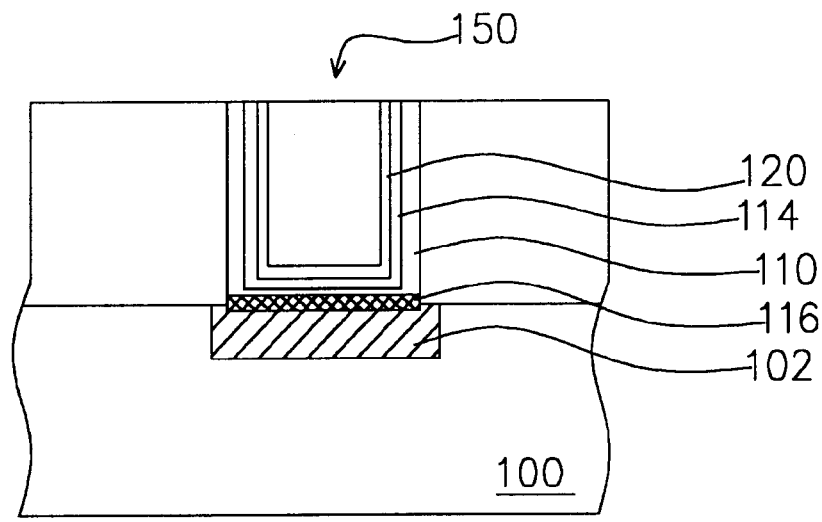

Referring to FIG. 9, a chemical-mechanical polishing process is performed to remove portions of the conductive layer 122, the second metal nitride barrier layer 120, and the first metal nitride barrier layer 114, and the first refractory metal layer 110 until the dielectric layer 104 is exposed. A contact plug 150 is formed.

With the approach of the present invention, by performing a RT process and then forming a second metal nitride barrier layer 120 is to eliminate the formation of oxide film on the surface of the second metal nitride barrier layer 120 in order to promote good adhesion between the dielectric layer 104 and the conductive layer 122. Because formation of oxide film on the second metal nitride barrier layer 120 is prevented, the difference of zeta potential values of the second metal nitride barrier layer 120 and the conductive layer 122 can be maintained large, therefore repulsion between the second metal nitride barrier layer 120 and the conductive layer 122 can be eliminated, consequently this condition promotes good gap-fill. As a result, generation of voids can also be prevented, consequently, device failure due to electromigration can be effectively eliminated. Because of the large difference of zeta potential values between the second metal nitride barrier layer 120 and the conductive layer 122, adhesion between the dielectric layer 104 and the conductive layer 122 is increased, thus cracking of the first refractory metal layer 110, the first and the second metal nitride barrier layers 114 and 120 is effectively prevented. Because the first refractory metal layer 110, the first and second metal nitride barrier layers 114 and 120 are not cracked or fractured, the first and second metal nitride barrier layers 114 and 120 can effectively prevent the diffusion of metal ions or atoms into the dielectric layer 104, thus shorting of devices can be prevented. Since the lattice structure of the conductive layer 122 in the contact is not damaged and the adjacent first refractory metal layer 110, the first and second metal nitride barrier layers 114 and 120 are undamaged, generation of voids due to electromigration can be prevented, thus device failures due to electromigration can be eliminated. Therefore the reliability of the device can be substantially increased.

With the approach of the present invention, by performing a RTP process is to effect a reaction between the silicon atoms of the conductive region 102 and the first refractory metal layer 110 to form a metal-silicide layer 116. Because the metal-silicide film 116 is a refractory metal having low resistivity, the contact resistance can be substantially decreased, therefore the RC delay time can be substantially decreased. Thus the operating speed of the device can be substantially increased.

Further, because a second metal nitride barrier layer 120 is formed over the first metal nitride barrier layer 114, therefore the thickness of the barrier metal layer can be increased to adequately function as a barrier metal layer.

FIGS. 10 through 14 are schematic, cross sectional views showing the progression of manufacturing steps in fabricating contact plug in accordance to the second embodiment of the present invention.

Figure 10:
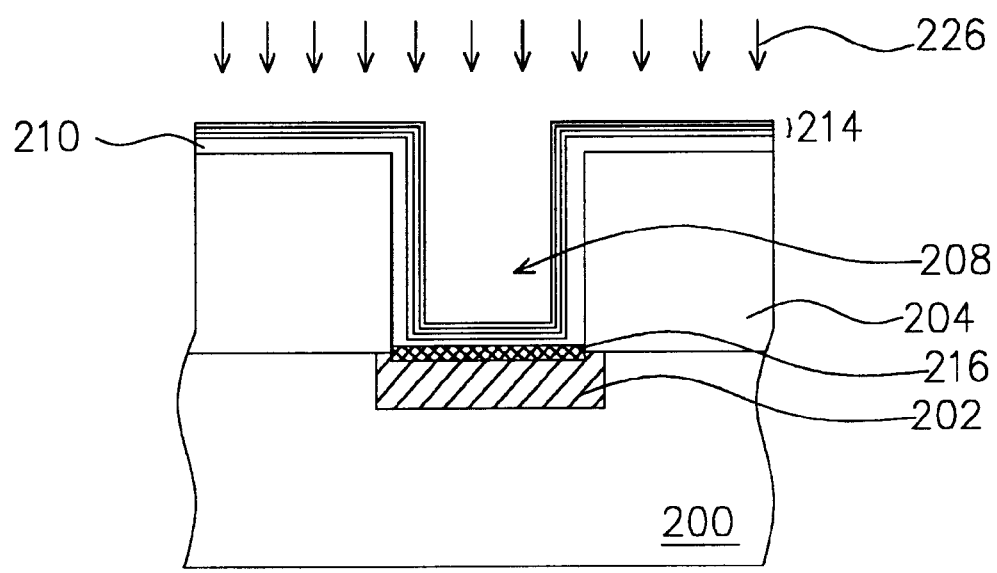
FIGS. 10 through 14 are schematic, cross sectional views showing the progression of manufacturing steps in fabricating contact plug in accordance to the second preferred embodiment of the present invention.

Referring to FIG. 10, a substrate 200 having a conductive region 202 formed thereon, is provided. The conductive region 202 is comprised of, for example, a doped region in a silicon substrate, a silicon-based conductive line, a silicon-based gate structure, and the like. A dielectric layer 204 composed of low dielectric constant material, for example spin-on-polymers (SOP) materials, is formed over the substrate 200. A photolithographic and etching process is carried out to form a contact opening 208 in the dielectric layer 204 until the conductive region 202 is exposed within the opening 208. A pre-clean step is carried out to clean the resides from the surface of the dielectric layer 204, and more importantly, to clean the residues from the surface of the sidewall and the bottom of the contact opening which would otherwise increase the contact resistance. The pre-clean step comprises a wet etch or a dry etch process, wherein the pre-clean step use buffer oxidant agents. In the dry etch process, preferably a plasma gas formed from argon gas is used. A thin conformal layer of a first refractory metal layer 210 is formed over the dielectric layer 204 and the contact opening 208. The first refractory metal layer 210, for example is made of titanium (Ti), or tantalum (Ta). Next, a multi-layered metal nitride barrier layer 214 over the first refractory metal layer 210. The multi-layered metal nitride barrier layer 214 is formed, for example, by depositing a first refractory metal nitride layer comprised of TiN or TaN material of thickness of about 120–160 angstroms by performing a MOCVD process, and then treating the first refractory metal nitride layer with a plasma gas to transform the first refractory metal nitride layer into a metal nitride barrier layer. The said plasma treatment preferably comprises of a plasma gas containing an atmosphere of nitrogen and hydrogen. The deposition of the first refractory metal nitride layer and plasma treatments cycles follows, for example 1–3 cycles, until a desired thickness of a multi-layered metal nitride barrier layer 214 is formed. Next, a thermal-process 226 is carried out to trigger a reaction between the portion of the first refractory metal nitride layer 210 on the conductive region 202 and the silicon atoms of the conductive region 202 to form a metal silicide film 216. The thermal process is preferably a rapid-thermal-process (RTP). The RTP is preferably carried out in an atmosphere of nitrogen, at a temperature of about 550–700° C., for a duration of about 3–180 seconds. Since the metal silicide film 216 is refractory metal having low resistivity, the contact resistance is decreased.

Figure 11:
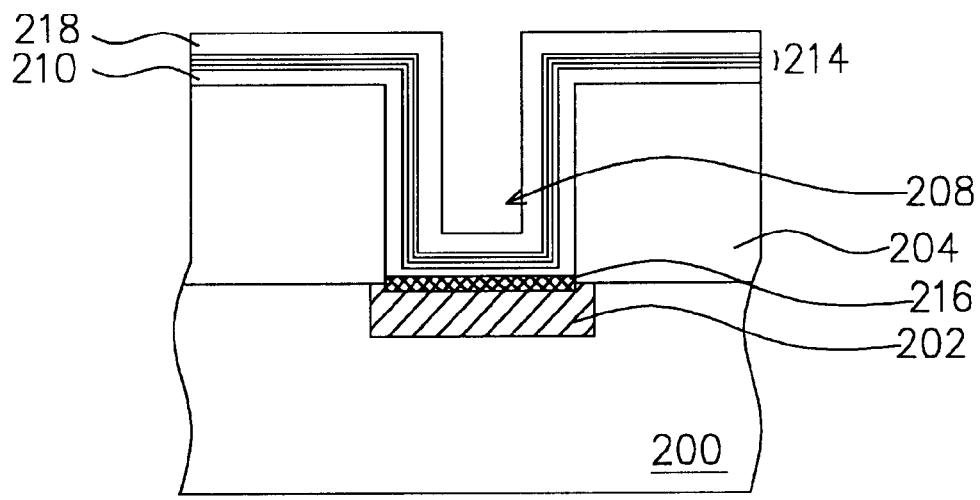

Referring to FIG. 11, a second refractory metal nitride layer 218, for example TiN or TaN, is formed on the multi-layered metal nitride barrier layer 214. The second refractory metal nitride layer 218 is preferably deposited by using a conventional deposition technique such as MOCVD, and a preferable thickness of about 120–160 angstroms.

Figure 12:
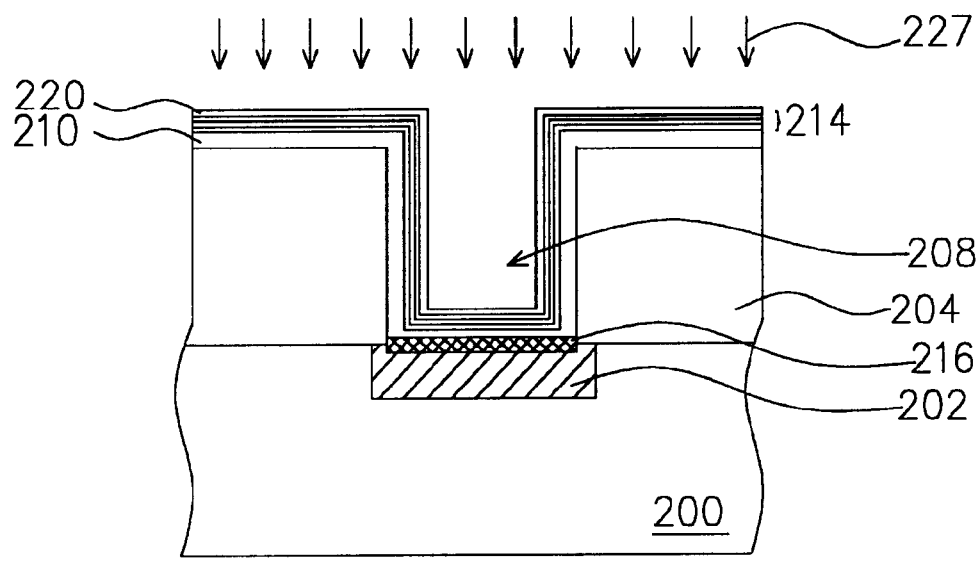

Referring to FIG. 12, similarly a plasma treatment 227 on the second refractory metal nitride layer 218 is carried out to transform the second refractory metal nitride layer 218 into a thinner metal nitride barrier layer 220, reduced to a thickness of about 40–60 angstroms. The plasma treatment process preferably comprises a plasma gas containing nitrogen and hydrogen gas.

Figure 13:
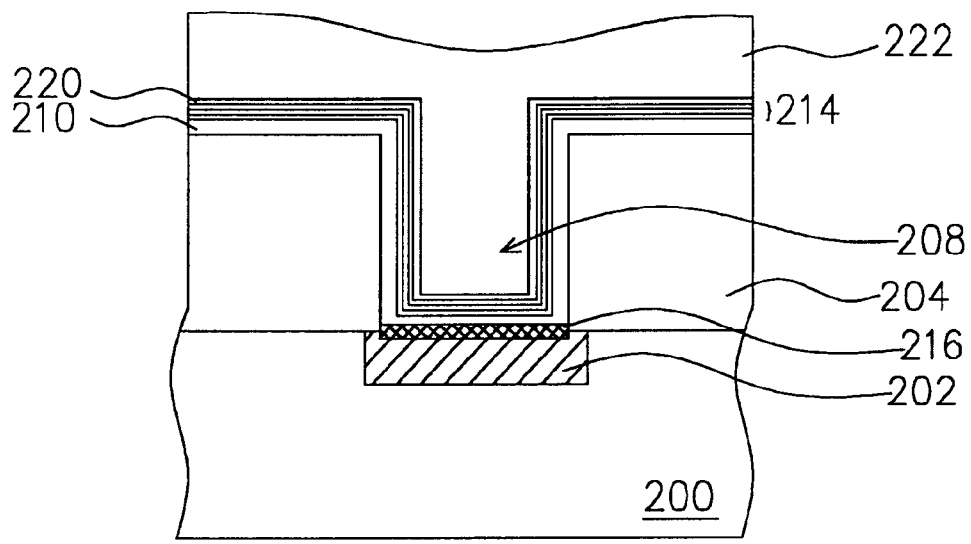

Referring to FIG. 13, a conductive metal layer 222, for example tungsten is deposited over the dielectric layer 204 filling the contact opening 208 by performing a conventional metal deposition technique, such as CVD, or electro-chemical deposition (ECD) method. As the zeta potential values of the metal nitride barrier layer 220 and the conductive layer 222 are largely different, so they do not repel from each other resulting in a good gap-fill. Therefore adhesion between the dielectric layer 204 and the conductive layer 222 is increased, consequently cracking of the barrier layer can be effectively prevented.

Figure 14:
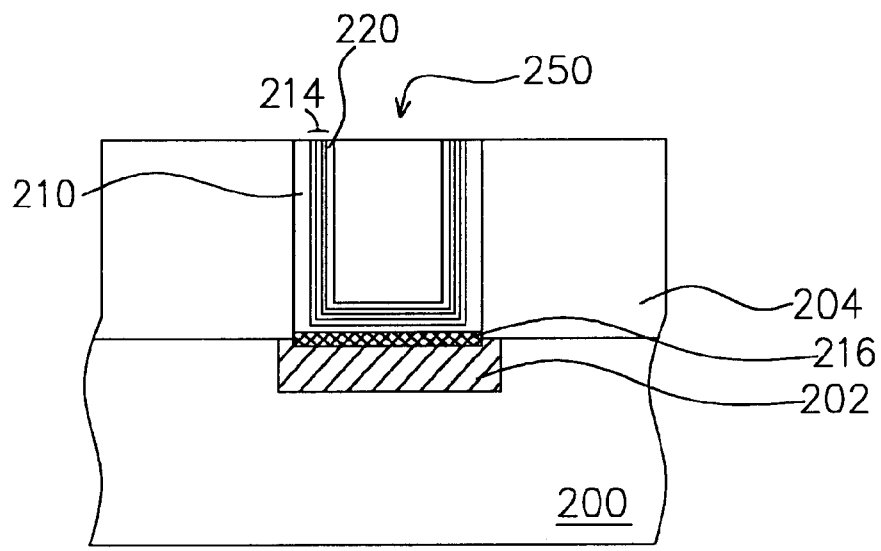

Referring to FIG. 14, a chemical-mechanical polishing process is performed to remove portions of the conductive layer 222, the metal nitride barrier layer 220, and the multi-layered metal nitride barrier layer 214, and the first refractory metal layer 210 until the dielectric layer 204 is exposed. A contact plug 250 is formed.

With the approach of the present invention, by performing a RT process 226 and then forming a metal nitride barrier layer 220 is to eliminate the formation of oxide film on the surface of the metal nitride barrier layer 220 in order to promote good adhesion between the dielectric layer 204 and the conductive layer 222. Because formation of oxide film on the metal nitride barrier layer 220 is prevented, the difference of zeta potential values of the second metal nitride barrier layer 220 and the conductive layer 222 can be maintained large, therefore repulsion between the metal nitride barrier layer 220 and the conductive layer 222 can be eliminated, consequently this condition promotes good gap-fill ability. As a result, generation of voids can also be prevented, consequently, device failure due to electromigration can be effectively eliminated. Because of the large difference of zeta potential values between the metal nitride barrier layer 220 and the conductive layer 222, adhesion between the dielectric layer 204 and the conductive layer 222 is increased, thus cracking of the first refractory metal layer 210, the multi-layered metal nitride barrier layer 214 and the metal nitride barrier layer 220 is effectively prevented. Because the first refractory metal layer 210, the first and the metal nitride barrier layers 214 and 220 are not cracked or fractured, the metal nitride barrier layers 214 and 220 can effectively prevent the diffusion of metal ions or atoms into the dielectric layer 204, thus shorting of devices can be prevented. Since the lattice structure of the conductive layer 222 in the contact is not damaged and the adjacent first refractory metal layer 210, the metal nitride barrier layers 214 and 220 are undamaged, generation of voids due to electromigration can be prevented, thus device failures due to electromigration can be eliminated. Therefore the reliability of the device can be substantially increased.

With the approach of the present invention, by performing a RTP process 226 is to effect a reaction between the silicon of the conductive region 202 and the first refractory metal layer 210 to form a metal-silicide layer 216. Because the metal-silicide film 216 is a refractory metal having low resistivity, the contact resistance can be substantially decreased, therefore the RC delay time can be substantially decreased. Thus the operating speed of the device can be substantially increased.

Further, because a second metal nitride barrier layer 218 is formed over the first metal nitride barrier layer 214, therefore the thickness of the barrier metal layer can be increased to adequately function as a barrier metal layer.

Further, although the embodiments of the present invention are directed to a method for fabricating a contact barrier metal, it also will be recognized by those skilled in the art that other techniques of forming interconnect, such as the single/dual damascene technique, or other traditional techniques of forming vias or plugs which involve filling an opening with conductive materials such as copper, tungsten or aluminum may be used to practice the present invention.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

It is to be understood that the foregoing general description and the following detailed description are exemplary, and are intended to provide further explanation of the invention as claimed.

What is claimed is:

1. A method for fabricating contact plug, the method comprising the steps of:
   providing a semiconductor substrate having a conductive region formed thereon;
   forming a dielectric layer over the substrate;
   forming a contact opening in the dielectric layer, wherein the conductive region is exposed within the contact opening;
   forming a first refractory metal layer over the dielectric layer and the contact opening;
   forming a first refractory metal nitride layer on the first refractory metal layer, wherein the first refractory metal nitride layer is formed by performing a metalorganic chemical deposition method;
   performing a first plasma treatment to transform the first refractory metal nitride layer into a first metal nitrided barrier layer;
   performing a thermal-process to trigger a reaction between the first refractory metal layer and the silicon atoms in the conductive region to form a metal silicide on the conductive region;
   forming a second refractory metal nitride layer on the first metal nitrided barrier layer, wherein the second refractory metal nitride layer is formed by performing a metalorganic chemical deposition method;
   performing a second plasma treatment to transform the second refractory metal nitride layer into a second metal nitrided barrier layer; and
   forming a conductive layer over the second metal barrier layer to fill the contact opening.

2. The method according to claim 1, wherein the thermal process comprises a rapid-thermal-process (RTP).

3. The method according to claim 2, the RTP is carried out at a temperature of 550° C. to 700° C. and for a duration of 3–180 seconds.

4. The method according to claim 1, wherein the first and the second plasma treatment comprises plasma gas including nitrogen and hydrogen.

5. The method of claim 1, wherein the thickness of the first and the second refractory metal nitride layers is 120–160 angstroms.

6. The method of claim 1, wherein the thickness of the first and the second metal nitride barrier layers is 40–60 angstroms.

7. The method according to claim 1, wherein before the step of the forming the first refractory metal layer further comprises a pre-cleaning step.

8. The method according to claim 6, wherein the pre-cleaning step use a plasma gas containing argon gas.

9. The method according to claim 1, wherein the material of the conductive layer is selected from a group consisting of copper, aluminum and tungsten and alloys thereof.

10. The method according to claim 1, wherein the material of the second and third refractory metal nitride layer comprises of titanium nitride or tantalum nitride.

11. The method according to claim 1, wherein the conductive region is selected form a group consisting of a doped region, a silicon-based gate structure and silicon-based conductive line.

12. A method for fabricating contact plug, the method comprising the steps of:
   providing a semiconductor substrate having a conductive region formed thereon;
   forming a dielectric layer over the substrate;
   forming a contact opening in the dielectric layer, wherein the conductive region is exposed within the contact opening;
   forming a first refractory metal layer over the dielectric layer and the contact opening;
   forming a multi-layered metal nitride barrier layer, wherein the multi-layered metal nitride barrier layer is formed by performing a multiple cycle of depositing a first refractory metal nitride layer and then performing a first plasma gas treatment, wherein the first refractory metal nitride layer is deposited by performing a metalorganic chemical deposition process;
   performing a thermal-process to trigger a reaction between the first refractory metal layer and the silicon atoms in the conductive region to form a metal silicide on the conductive region;
   forming a second refractory metal nitride layer on the multi-layered metal nitride barrier layer, wherein the second refractory metal nitride layer is formed by performing a metalorganic chemical deposition method;
   performing a second plasma treatment to transform the second refractory nitride metal layers into a metal nitride barrier layer; and
   forming a conductive layer over the metal nitride barrier layer filling contact opening.

13. The method according to claim 12, wherein the thermal process comprises a rapid-thermal-process (RTP).

14. The method according to claim 12, wherein the RTP is carried out at a temperature of 550 to 700° C. and for a duration of 3–180 seconds.

15. The method according to claim 12, wherein the first and the second plasma treatment comprises a plasma gas including nitrogen and hydrogen.

16. The method according to claim 12, wherein the material of the conductive layer is selected from a group consisting of copper, aluminum and tungsten and alloys thereof.

17. The method according to claim 12, wherein the material of the first and the second refractory metal nitride layers comprises of titanium nitride or tantalum nitride.

18. The method according to claim 12, wherein the conductive region is selected from a group consisting of a doped region, a silicon-based gate structure and a silicon-based conductive line.

* * * * *